United States Patent
Akagawa et al.

(10) Patent No.: US 9,266,196 B2
(45) Date of Patent: *Feb. 23, 2016

(54) AG BALL, AG CORE BALL, FLUX-COATED AG BALL, FLUX-COATED AG CORE BALL, SOLDER JOINT, FORMED SOLDER, SOLDER PASTE AND AG PASTE

(71) Applicant: Senju Metal Industry Co., Ltd., Tokyo (JP)

(72) Inventors: Takashi Akagawa, Tochigi-ken (JP); Hiroyoshi Kawasaki, Tochigi-ken (JP); Kazuhiko Matsui, Tochigi-ken (JP); Yuichi Koikeda, Tochigi-ken (JP); Masaru Sasaki, Tochigi-ken (JP); Hiroyuki Yamasaki, Tochigi-ken (JP); Takahiro Roppongi, Tochigi-ken (JP); Daisuke Soma, Tochigi-ken (JP); Isamu Sato, Saitama-ken (JP)

(73) Assignee: SENJU METAL INDUSTRY CO., LTD., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/613,256

(22) Filed: Feb. 3, 2015

(65) Prior Publication Data

US 2015/0217409 A1 Aug. 6, 2015

(30) Foreign Application Priority Data

Feb. 4, 2014 (JP) .................................. 2014-019718

(51) Int. Cl.
*H01B 5/00* (2006.01)
*H01L 23/48* (2006.01)
(Continued)

(52) U.S. Cl.
CPC ............... *B23K 35/025* (2013.01); *B23K 35/00* (2013.01); *B23K 35/0244* (2013.01);
(Continued)

(58) Field of Classification Search
CPC .. B23K 35/262; B23K 35/264; B23K 35/025; B23K 35/0244; B23K 35/302; B23K 35/3006; H01B 1/02; C22C 9/00; C22C 13/00; C22C 13/02; C22C 5/06
USPC .................. 174/126.2, 256; 257/738; 428/457
See application file for complete search history.

(56) References Cited

U.S. PATENT DOCUMENTS

| | | | | |
|---|---|---|---|---|
| 5,851,482 | A | * 12/1998 | Kim | ..................... B23K 35/262 420/557 |
| 6,474,537 | B1 | * 11/2002 | Hasegawa | ................ B23K 1/08 228/103 |

(Continued)

FOREIGN PATENT DOCUMENTS

| JP | 09-275120 | 10/1997 |
|---|---|---|
| JP | 10-025502 | 1/1998 |

(Continued)

OTHER PUBLICATIONS

Decision to Grant a Patent for Japanese Priority Application No. 2014-019718, Dispatch date Apr. 1, 2014, with English translation, 6 pgs.

*Primary Examiner* — Sherman Ng

(74) *Attorney, Agent, or Firm* — Chernoff, Vilhauer, McClung & Stenzel, LLP

(57) ABSTRACT

Providing an Ag ball having a low alpha dose and a high sphericity regardless of impurity elements having an amount equal to or more than a predetermined value except for Ag. In order to suppress a soft error and reduce an connection fault, a content of U is equal to or less than 5 ppb, a content of Th is equal to or less than 5 ppb, a purity is equal to or more than 99.9% but equal to or less than 99.9995%, an alpha dose is equal to or less than 0.0200 cph/cm$^2$, a content of either Pb or Bi or a total content of both Pb and Bi is equal to or more than 1 ppm, and a sphericity is equal to or more than 0.90.

39 Claims, 6 Drawing Sheets

(51) Int. Cl.

| | | |
|---|---|---|
| B32B 15/04 | (2006.01) | |
| B23K 35/02 | (2006.01) | |
| B23K 35/00 | (2006.01) | |
| C22C 5/06 | (2006.01) | |
| B23K 35/30 | (2006.01) | |
| H01B 1/02 | (2006.01) | |
| H01L 23/00 | (2006.01) | |
| C22C 19/03 | (2006.01) | |
| C22C 19/07 | (2006.01) | |

(52) U.S. Cl.
CPC ........ *B23K 35/3006* (2013.01); *B23K 35/3033* (2013.01); *B23K 35/3046* (2013.01); *C22C 5/06* (2013.01); *H01B 1/02* (2013.01); *H01L 24/13* (2013.01); *C22C 19/03* (2013.01); *C22C 19/07* (2013.01); *H01L 2224/13014* (2013.01); *H01L 2224/13139* (2013.01); *H01L 2224/13655* (2013.01); *H01L 2224/13657* (2013.01); *H01L 2924/0105* (2013.01); *H01L 2924/0109* (2013.01); *H01L 2924/01082* (2013.01); *H01L 2924/01083* (2013.01); *H01L 2924/01092* (2013.01); *H01L 2924/15311* (2013.01); *H01L 2924/15321* (2013.01); *H01L 2924/15331* (2013.01); *H01L 2924/2064* (2013.01); *H01L 2924/2065* (2013.01); *H01L 2924/20641* (2013.01); *H01L 2924/20642* (2013.01); *H01L 2924/20643* (2013.01); *H01L 2924/20644* (2013.01); *H01L 2924/20645* (2013.01); *H01L 2924/20646* (2013.01); *H01L 2924/20647* (2013.01); *H01L 2924/20648* (2013.01); *H01L 2924/20649* (2013.01)

(56) References Cited

U.S. PATENT DOCUMENTS

| | | | | |
|---|---|---|---|---|
| 2002/0074656 | A1* | 6/2002 | Ujiie | H01L 23/3107 257/738 |
| 2009/0232696 | A1* | 9/2009 | Ohnishi | B23K 35/262 420/561 |
| 2010/0035072 | A1* | 2/2010 | Watanabe | B22F 1/0059 428/457 |
| 2013/0028786 | A1* | 1/2013 | Kanou | B23K 35/262 420/558 |
| 2014/0042622 | A1* | 2/2014 | Tsai | H01L 23/49816 257/738 |

FOREIGN PATENT DOCUMENTS

| | | |
|---|---|---|
| JP | 2003-193283 | 7/2003 |
| JP | 2011-214040 A | 10/2011 |
| WO | 9524113 A1 | 9/1995 |

\* cited by examiner

TABLE 1

| | Ag | Cu | Bi | Fe | Al | Sn | Pb | Ni | Au | S | Mg | Ti | Co | B | Si | Pd | Se | U | Th | PURITY | ALPHA DOSE cph/cm² | SPHERICITY OF Ag BALL |
|---|---|---|---|---|---|---|---|---|---|---|---|---|---|---|---|---|---|---|---|---|---|---|
| | | | | | | | | | RESULT OF ELEMENT ANALYSIS FOR Ag BALL | | | | | | | | | | | | |
| EMBODIMENT 1 | Bal. | 10.0 | 3.2 | 4.8 | 1.2 | 1.7 | 1.3 | 1.7 | 0.3 | 0.1 | 0.4 | 0.1 | 0.3 | 0.8 | 0.2 | 4.7 | 3.0 | <0.2 | <0.2 | 99.99662 | <0.0010 | 0.9620 |
| EMBODIMENT 2 | Bal. | 0.8 | 2.2 | 4.3 | 0.3 | 0.4 | 4.0 | 1.3 | 0.1 | 0.2 | 0.2 | 0.1 | 0.3 | 0.2 | 0.3 | 3.0 | 0.4 | <0.2 | <0.2 | 99.99819 | <0.0010 | 0.9570 |
| COMPARISON EXAMPLE 1 | Bal. | 0.4 | 0.1 | 0.1 | 0.1 | 0.1 | 0.3 | 0.1 | 0.1 | 0.1 | 0.2 | 0.1 | 0.1 | 0.5 | 0.1 | 0.1 | 0.1 | <0.2 | <0.2 | 99.99974 | <0.0010 | 0.8911 |

FIG. 4

TABLE 2

| | SOLDER COMPOSITION | | | | | | | | | | | | | | | α DOSE OF Ag CORE BALL (cph/cm²) | SPHERICITY OF Ag CORE BALL |
|---|---|---|---|---|---|---|---|---|---|---|---|---|---|---|---|---|---|
| | Sn | Sb | Cu | Bi | Zn | Fe | Al | As | Ag | In | Cd | Ni | Pb | Au | U | Th | | |
| EMBODI-MENT 3 | bal. | 1 | 0 | 0 | 0 | 1 | 0 | 0 | 2 | 4 | 0 | 2 | 3 | 0 | <0.2 | <0.2 | <0.0010 | 0.9622 |
| Sn SHEET MATERIAL | bal. | 11 | 0 | 18 | 0 | 5 | 0 | 21 | 6 | 11 | 0 | 30 | 49 | 1 | <0.2 | <0.2 | 0.2030 | - |

FIG. 5

TABLE 3

| | FLUX (1C) | FLUX (2C) | FLUX (3C) | FLUX (4C) |
|---|---|---|---|---|
| ROSIN ESTER | 5% | — | — | — |
| HYDROGENATED ROSIN | — | 5% | — | — |
| 2-PHENYLIMIDAZOLE | — | 5% | — | — |
| SEBACIC ACID | — | — | 10% | — |
| STEARIC ACID | 5% | — | — | — |
| TRANS-2,3-DIBROMO-2-BUTENE-1,4-DIOL | — | — | — | 10% |
| ISOPROPYL ALCOHOL | 90% | 90% | 90% | 90% |

FIG. 6

TABLE 4

| | EMBODIMENT 1D | EMBODIMENT 2D | EMBODIMENT 3D | EMBODIMENT 4D | COMPARISON EXAMPLE 1D |
|---|---|---|---|---|---|
| Cu-OSP SUBSTRATE | OK | OK | OK | OK | NG |
| Ag PLATING Cu PLATE | OK | OK | OK | OK | NG |

FIG. 7

AG BALL, AG CORE BALL, FLUX-COATED AG BALL, FLUX-COATED AG CORE BALL, SOLDER JOINT, FORMED SOLDER, SOLDER PASTE AND AG PASTE

CROSS REFERENCE TO RELATED APPLICATION

The present invention contains the subject matter related to Japanese Patent Application No. 2014-019718 filed in the Japanese Patent Office on Feb. 4, 2014, the entire contents of which being incorporated herein by reference.

BACKGROUND OF THE INVENTION

1. Field of the Invention

The present invention relates to an Ag ball having a low alpha ($\alpha$) dose; an Ag core ball having the Ag ball coated with a solder plating; a flux-coated Ag ball having the Ag ball coated with a flux layer; a flux-coated Ag core ball having the Ag core ball coated with the flux layer; a solder joint using the Ag ball, the flux-coated Ag ball, the Ag core ball and a flux-coated Ag core ball; a formed solder using the Ag ball, the flux-coated Ag ball, the Ag core ball and the flux-coated Ag core ball; a solder paste using the Ag ball, the flux-coated Ag ball, the Ag core ball and the flux-coated Ag core ball; and an Ag paste using the Ag ball.

2. Description of Related Art

Recently, along development of compact information equipment, electronic components to be mounted on them have been downsized rapidly. A ball grid alley (hereinafter referred to as "BGA") having electrodes at its rear surface is applied to such electronic components in order to satisfy a requirement of a narrowed connection terminal and a reduced mounting area because of the downsizing requirement.

The electronic components using the BGA are, for example, semiconductor packages. In the semiconductor packages, semiconductor chips having electrodes are sealed with resin. Solder bumps are formed on the electrodes of the semiconductor chips. The solder bump is formed by joining a solder ball to the electrode of the semiconductor chip. The semiconductor package having the BGA is mounted on a printed circuit board such that each solder bump touches a conductive land of the printed circuit board. Then, the solder bump and the land are joined by melting the solder bump with heating so that the semiconductor package is mounted on the printed circuit board. Recently, a three-dimensional high-density package is studied by stacking up the semiconductor packages in a height direction in order to meet the further high-density mounting.

However, if the BGA is applied to the semiconductor package of the three-dimensional high-density mounting, the solder ball may be crushed by a semiconductor package's weight and a shorted circuit occurs between the electrodes. This affects the high-density mounting.

Therefore, another type of the solder bump is investigated wherein the bump is a ball having a small diameter and is formed by a metal such as Ag, etc. having a melting point more than the solder. Even if the weight of the semiconductor package is loaded to the solder bump having the Ag ball when the electronic component is mounted on the printed circuit board, then the Ag ball can support the semiconductor package because the Ag ball does not melt at the melting temperature of the solder. Therefore, the solder ball is not crushed by the semiconductor package's weight. A related technology is disclosed in, for example, Japanese Patent Application Publication No. 2011-214040 (hereinafter referred to as "JP2011-214040 publication").

By the way, the downsizing of the electronic components allows the high-density mounting, but the high-density mounting causes soft error problems. The soft error causes a possibility of rewriting a storage content of a memory cell in a semiconductor integrated circuit (IC circuit) with an alpha ray entering the memory cell. It is conceivable that the alpha ray is emitted by alpha decay of radioactive elements such as U, Th, Po in the solder alloy. Thus, solder materials having low alpha dose are being developed recently by reducing contents of the radioactive elements.

Therefore, Ag and Ag alloy having the low alpha dose are required as discussed in the JP2011-214040 publication.

However, it has not been considered to balance the alpha dose and a sphericity of the Ag ball until now wherein the sphericity represents a deviation from a true sphere. Therefore, the soft error problem was not resolved. A cause of this problem was that a standoff height was controlled when the solder bump was formed, there were the radioactive elements and isotopes in the impurities in the Ag ball, and these elements and isotopes were diffused to emit the alpha ray after the soldering joint of the Ag ball. Then, the alpha ray emitted from the Ag ball entered the memory cell of the semiconductor chip and the soft error occurred.

The Ag ball having the high sphericity and the low alpha dose is required as discussed hereinbefore; however, no prior art including the JP2011-214040 publication did not discuss at all the Ag ball having both the high sphericity and the low alpha dose. The Ag ball was manufactured traditionally by heating the Ag material to a temperature equal to or more than 1,300° C. and melting the material. Thus, it was conceivable that a content of the radioactive isotope such as Po of emitting the alpha ray was reduced significantly by the volatilization so that the alpha ray of Ag might not affect the soft error.

However, it was not proved in the prior art that the manufacturing condition for the Ag ball caused to reduce the alpha ray from the Ag ball to prevent the soft error. Since a boiling point of $^{210}$Po is 962° C., it may be volatized sufficiently not to generate the soft error if heating to a temperature equal to or more than 1300° C. However, since the heating at the manufacturing process of the Ag ball did not purpose to volatilize Po, there was no guarantee to reduce the amount of $^{210}$Po at this temperature. Thus, it is doubtful that the conventional manufacturing process of the Ag ball produces the Ag ball having the low alpha dose.

It is conceivable to manufacture the Ag ball by using the Ag material having a high purity. However, in this case, it is not required to reduce a content of elements not to participate the alpha dose of the Ag ball. When the Ag material having the high purity is used without thought, its cost only rises.

If the sphericity of the Ag ball is low, the original function of the Ag ball does not work to control the standoff height when forming the solder bump. In this case, the bumps having uneven heights are formed so that a problem occurs at the mounting process.

SUMMARY OF THE INVENTION

Therefore, the Ag ball having the high sphericity is desired judging from the above described background.

The subject matter of the present invention is to provide an Ag ball; an Ag core ball having the Ag ball coated with a solder plating; a flux-coated Ag ball having the Ag ball coated with a flux layer; a flux-coated Ag core ball having the Ag core ball coated with the flux layer; a solder joint using the Ag ball, the flux-coated Ag ball, the Ag core ball and a flux-coated Ag core ball; a formed solder using the Ag ball, the flux-coated Ag ball, the Ag core ball and the flux-coated Ag core ball; a solder paste using the Ag ball, the flux-coated Ag ball, the Ag core ball and the flux-coated Ag core ball; and an Ag paste using the Ag ball. All of them have a low alpha dose but a high sphericity regardless of inclusion of a predetermined amount of impurity elements.

The inventors found that even if the purity of the commercial Ag material was 99.9-99.9995%, U and Th contained in the material reduced to a value equal to or less than 5 ppb. It is assumed that the purity of Ag or the like represents 99% as 2N, 99.9% as 3N, 99.99% as 4N and 99.9995% as 5N5. The inventors focused on a fact that a cause of the soft error was a small amount of the remained $^{210}$Po whose content could not be measured in a quantitative way. In addition, the inventors found that the alpha dose of the Ag ball was suppressed to a value equal to or less than 0.0200 cph/cm$^2$ even if the purity of the Ag ball was equal to or less than 5N5 in a case that the Ag material was heat-treated, a temperature of the molten Ag was set relatively high or the Ag ball was heat-treated after being formed to the sphere during the Ag ball manufacturing process.

In addition, the inventors found that the purity of the Ag ball should be equal to or less than 5N5, i.e. elements contained in the Ag ball except Ag (hereinafter referred to as "impurity element") should be equal to or less than 5 ppm in order to increase the sphericity of the Ag ball. Then, the inventors completed the present invention.

The present invention is as follows:

According to a first aspect of the present invention, an Ag ball is characterized in that a content of an element U is equal to or less than 5 ppb, a content of an element Th is equal to or less than 5 ppb, a purity is equal to or more than 99.9% but equal to or less than 99.9995%, an alpha dose is equal to or less than 0.0200 cph/cm$^2$, a content of either Pb or Bi or a total content of both Pb and Bi is equal to or more than 1 ppm, and a sphericity is equal to or more than 0.90.

According to a second aspect of the present invention, the Ag ball as recited in the first aspect is characterized in that the alpha dose is equal to or less than 0.0010 cph/cm$^2$.

According to a third aspect of the present invention, the Ag ball as recited in the first or second aspect is characterized in that its diameter is 1-1,000 μm.

According to a fourth aspect of the present invention, a formed solder is characterized in that the Ag balls as recited in one of the first through third aspects are dispersed in the solder.

According to a fifth aspect of the present invention, a solder paste is characterized in that the paste contains the Ag ball as recited in one of the first through third aspects.

According to a sixth aspect of the present invention, an Ag paste is characterized in that the Ag paste contains the Ag ball as recited in one of the first through third aspects.

According to a seventh aspect of the present invention, a solder joint is characterized in that the solder joint uses the Ag ball as recited in one of the first through third aspects.

According to an eighth aspect of the present invention, a flux-coated Ag ball comprises the Ag ball as recited in one of the first through third aspects and a flux layer for coating the Ag ball.

According to a ninth aspect of the present invention, a formed solder is characterized in that the flux-coated Ag balls as recited in the eighth aspect are dispersed in the solder.

According to a tenth aspect of the present invention, a solder paste contains the flux-coated Ag ball as recited in the eighth aspect.

According to an eleventh aspect of the present invention, an Ag paste contains the flux-coated Ag ball as recited in the eighth aspect.

According to a twelfth aspect of the present invention, a solder joint uses the flux-coated Ag ball as recited in the eighth aspect.

According to a thirteenth aspect of the present invention, an Ag core ball comprises the Ag ball as recited in one of the first through third aspects, and a solder layer for coating the Ag ball, wherein a content of an element U in the solder layer is equal to or less than 5 ppb and a content of an element Th in the solder layer is equal to or less than 5 ppb.

According to a fourteenth aspect of the present invention, the Ag core ball as recited in the thirteenth aspect is characterized in that the alpha dose is equal to or less than 0.0200 cph/cm$^2$.

According to a fifteenth aspect of the present invention, the Ag core ball as recited in thirteenth or fourteenth aspect is characterized in that the alpha dose of the Ag core ball is equal to or less than 0.0010 cph/cm$^2$.

According to a sixteenth aspect of the present invention, the Ag core ball as recited in one of the thirteenth through fifteenth aspects is characterized in that its diameter is 1-1,000 μm.

According to a seventeenth aspect of the present invention, the Ag core ball as recited in one of the thirteenth through sixteenth aspects is characterized in that the Ag ball is coated with a layer comprising at least one element selected from Ni and Co and the coated Ag ball is coated with the solder layer.

According to an eighteenth aspect of the present invention, a formed solder is characterized in that the Ag core balls as recited in one of the thirteenth through seventeenth aspects are dispersed in the solder.

According to a nineteenth aspect of the present invention, a solder paste contains the Ag core ball as recited in one of the thirteenth through seventeenth aspects.

According to a twentieth aspect of the present invention, an Ag core paste contains the Ag core ball as recited in one of the thirteenth through seventeenth aspects.

According to a twenty-first aspect of the present invention, a solder joint uses the Ag core ball as recited in one of the thirteenth through seventeenth aspects.

According to a twenty-second aspect of the present invention, a flux-coated Ag core ball comprises the Ag core ball as recited in one of the thirteenth through seventeenth aspects and a flux layer for coating the Ag core ball.

According to a twenty-third aspect of the present invention, a formed solder is characterized in that the flux-coated Ag core balls as recited in the twenty-second aspect are dispersed in the solder.

According to a twenty-fourth aspect of the present invention, a solder paste contains the flux-coated Ag core ball as recited in the twenty-second aspect.

According to a twenty-fifth aspect of the present invention, an Ag core paste contains the flux-coated Ag core ball as recited in the twenty-second aspect.

According to a twenty-sixth aspect of the present invention, a solder joint uses the flux-coated Ag core ball as recited in the twenty-second aspect.

BRIEF DESCRIPTION OF THE DRAWINGS

FIG. 4 shows Table 1 that represents a result of an element analysis of an Ag ball;

FIG. 5 shows Table 2 that represents solder compositions;

FIG. 6 shows Table 3 that represents flux composition; and

FIG. 7 shows Table 4 that represents embodiments' results.

DESCRIPTION OF THE PREFERRED EMBODIMENTS

Figure 1:
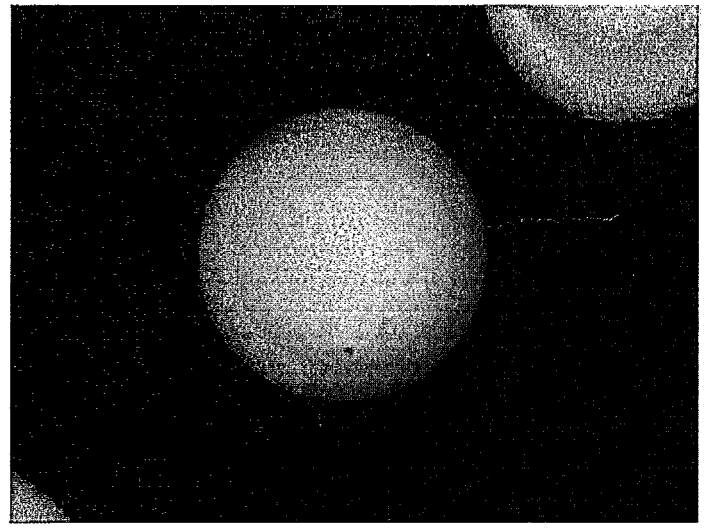
FIG. 1 shows a SEM photograph of an Ag ball of a first embodiment according to the present invention.

The present invention will be described in detail. In this specification, units (ppm, ppb and %) of a composition of an Ag ball represent rates (mass ppm, mass ppb and mass %) to a mass of the Ag ball if not being specified. Units (ppm, ppb and %) of a composition of a solder film of an Ag core ball represent rates (mass ppm, mass ppb and mass %) to a mass of the solder film if not being specified.

According to the Ag ball of the present invention, a content of an element U is equal to or less than 5 ppb; a content of an element Th is equal to or less than 5 ppb; a purity is equal to or more than 99.9% but equal to or less than 99.9995%; an alpha dose is equal to or less than 0.0200 cph/cm$^2$; a content of either Pb of Bi or a total content of both Pb and Bi is equal to or more than 1 ppm; and a sphericity is equal to or more than 0.90.

The composition, alpha dose and sphericity of the Ag ball according to the present invention will be described hereinafter in detail.

[U: Equal to or Less than 5 Ppb, Th: Equal to or Less than 5 Ppb]

U and Th are radioactive elements. Their contents should be reduced to suppress the soft error. In order to reduce the alpha dose of the Ag ball to a value equal to or less than 0.0200 cph/cm$^2$, the content of U and Th should be equal to or less than 5 ppb respectively. It is preferable that the content of U and Th is equal to or less than 2 ppb respectively from the viewpoint of the soft error suppression at the present or future high-density mounting.

[Purity of Ag Ball: Equal to or More than 99.9% but Equal to or Less than 99.9995%]

The purity of the Ag ball according to the present invention is equal to or more than 3N but equal to or less than 5N5. In other words, the content of the impurity elements is 5 ppm as the lower limit in the Ag ball of the present invention. When the purity of Ag composing the Ag ball is within this range, an enough amount of crystal cores can be maintained to improve the sphericity of the Ag ball. A reason of improving the sphericity will be discussed in detail hereinafter.

In manufacturing the Ag ball, the Ag material is a small piece of a predetermined shape, this Ag material melts by heating, the molten Ag becomes a sphere shape with a surface tension, and it coagulates to form the Ag ball. In a process from a liquid condition of the molten Ag to the coagulation, crystal grains grow up in the molten sphere-shaped Ag. In this case, if there are many impurity elements, these impurity elements become the crystal cores to suppress the growth of the crystal grains. Therefore, the sphere-shaped molten Ag becomes the Ag ball having the high sphericity with the micro crystal grains that are suppressed in their growth.

On the other hand, if the amount of the impurity elements is little, the relatively small amount thereof becomes the crystal grains so that the grains is not suppressed to grow but they grow in some direction. As a result, the sphere-shaped molten Ag coagulates wherein a part of its surface projects. The sphericity of such Ag ball is low. It is conceivable that the impurity elements are Cu, Bi, Fe, Al, Sn, Pb, Ni, Ti, Co, B, Si, Pd, Se, U, Th, etc.

The lower limit of the purity is not specified especially. However, the purity is preferably equal to or more than 3N in order to suppress the alpha dose and restrain the degradation of the electric conductivity and the heat conductivity of the Ag ball based on the reduced purity. In other words, the content of the impurity elements in the Ag ball is preferably equal to or less than 1,000 ppm.

[Alpha Dose: Equal to or Less than 0.0200 Cph/Cm$^2$]

The alpha dose of the Ag ball according to the present invention is equal to or less than 0.0200 cph/cm$^2$. This alpha dose is determined not to affect the soft error problem in the high-density mounting of the electronic components. In the present invention, the reheating treatment is performed in addition to the normal process for manufacturing the Ag ball. Therefore, the $^{210}$Po remained slightly in the Ag material volatilizes and the alpha dose of the Ag ball is further less than that of the Ag material. The alpha dose is preferably equal to or less than 0.0020 cph/cm$^2$ and more preferably equal to or less than 0.0010 cph/cm$^2$ from the viewpoint of the suppression of the soft error in the further high-density mounting.

[Content of Either Pb or Bi, or Total Content of Both Pb and Bi: Equal to or More than 1 Ppm]

It is conceivable that the impurity elements are Cu, Bi, Fe, Al, Sn, Pb, Ni, Ti, Co, B, Si, Pd, Se, U, Th, etc. According to the Ag ball of the present invention, it is preferable that the content of either Pb or Bi especially in the impurity elements or the total content of both Pb and Bi is equal to or more than 1 ppm as the impurity elements. According to the present invention, it is not necessary to reduce the content of either Pb or Bi or the total content of both Pb and Bi to the utmost limit in order to reduce the alpha dose. A reason thereof will be described hereinafter.

$^{210}$Pb changes to $^{210}$Bi with the beta decay, $^{210}$Bi changes to $^{210}$Po with the beta decay and $^{210}$Po changes to $^{210}$Pb with the beta decay. Therefore, it might be better that the content of either Pb or Bi as the impurity element or the total amount of both Pb and Bi is low as much as possible in order to reduce the alpha dose.

However, a ratio of the contained $^{210}$Pb to Pb and a ratio of the contained $^{210}$Bi to Bi are low. It is conceivable that $^{210}$Pb and $^{210}$Bi are sufficiently removed to reduce the alpha dose to the aforementioned range if the content of either Pb or Bi is reduced to some degree. On the other hand, in order to improve the sphericity of the Ag ball, it is preferably that the content of the impurity elements is large as described hereinbefore. Since either Pb or Bi is contained as the impurity element in the Ag material, it becomes the crystal core during the melting period in the manufacturing process of the Ag ball so that the sphericity of the Ag ball can be improved. Therefore, it is preferable to contain either Pb or Bi or both Pb and Bi under condition that the $^{210}$Pb and $^{210}$Bi can be reduced such that the alpha dose can be reduced to the aforementioned range. From this viewpoint, it is preferable that the content of either Pb or Bi or the total content of both Pb and Bi is equal to or more than 1 ppm according to the Ag ball of the present invention.

The content of either Pb or Bi or the total content of both Pb and Bi is more preferably equal to or more than 10 ppm. The upper limit is not specified if the alpha dose can be reduced. However, the content of either Pb or Bi or the total content of both Pb and Bi is preferably less than 1,000 ppm from the viewpoint that the electric conductivity of the Ag ball is suppressed from degradation. The content of Pb is more preferably 10-50 ppm and the content of Bi is more preferably 10-50 ppm.

[Sphericity of Ag Ball]

As for the shape of the Ag ball according to the present invention, its sphericity is preferably equal to or more than 0.90 from the viewpoint of controlling the standoff height. If the sphericity of the Ag ball is less than 0.90, the shape of the Ag ball is not identified, the bump having non-uniform height is formed during the bump forming process, and a possibility of occurring a fault junction is increasing. Its sphericity is more preferably equal to or more than 0.94. In this invention, the sphericity means a deviation from a true sphere. The sphericity is measured with many kinds of methods such as a least-square center method (LSC method), a minimum zone center method (MZC method), a maximum inscribed center method (MIC method), a minimum circumscribed center method (MCC method), etc.

[Diameter of Ag Ball: 1-1000 μm]

According to the Ag ball according to the present invention, it is preferable that its diameter is 1-1,000 μm. Within this range, it is possible to manufacture the sphere-shaped Ag ball stably and to prevent the connection from being shorted even if a pitch between the terminals is narrow. When the Ag ball of the present invention is used for, e.g., the paste, "Ag ball" may be called "Ag powder". When the "Ag ball" is used for the "Ag powder", the diameter of the Ag ball is generally 1-300 μm.

The Ag ball of the present invention can be applied to so-called Ag core ball wherein the Ag ball of the present invention acts as a core and its surface is coated with many kinds of solder plating. When the Ag ball of the present invention is used for the Ag core ball, a strike plating process may be applied thereto previously by hydrochloric acid Ag solution or the like. The strike plating process removes an oxide film from the Ag surface and improves the adhesiveness between the Ag ball and the solder plating during the manufacturing of the Ag core ball. In addition, the Ag ball and the Ag core ball of the present invention can be used for the solder joint for the electronic components.

Moreover, the Ag ball and the Ag core ball of the present invention can be used for the formed solder where the Ag balls or the Ag core balls are dispersed in the solder. In addition, the Ag ball and the Ag core ball of the present invention can be used for the solder paste powder that kneads the solder power, the Ag ball or the Ag core ball, and the flux. The formed solder and the solder paste comprise the solder alloy consisting of, for example, Sn-3Ag-0.5Cu (each number represents mass percentage). It should be noted that the present invention is not limited only to this solder alloy.

The Ag core ball according to the present invention will be described in detail hereinafter. The Ag core ball comprises the aforementioned Ag ball and the solder plating film for coating the surface of the Ag ball. The solder plating film of the present invention is formed by flowing the Ag ball as the main work and the plating solution. The elements Pb, Bi and Po form the salt in the plating solution and they are deposited by the flowage of the plating solution. Once the deposit as the salt is formed, it exists stably in the plating solution. According to the Ag core ball of the present invention, the deposit cannot be incorporated into the solder film, the content of the radioactive elements in the solder film can be reduced, and the alpha dose of the Ag core ball can be reduced.

[Composition of Solder Plating Film]

If the solder plating film comprises an alloy of a lead-free solder whose principal component is Sn, it is not limited especially. The solder plating film may be a Sn solder plating film. For example, the solder plating film may comprise Sn, Sn—Ag alloy, Sn—Cu alloy, Sn—Ag—Cu alloy, Sn—In alloy and the elements to which a predetermined alloy element is added. In each case, the content of Sn is equal to or more than 40 mass percent. The alloy elements as the additives are, for example, Ag, Cu, In, Ni. Co, Sb, Ge, P, Fe, etc. In these components, a desirable alloy composition for the solder plating film is Sn-3Ag-0.5Cu alloy from the viewpoint of the drop impact resistance.

A thickness of the solder plating film is not specially limited, but it is preferably equal to or less than 100 μm. Generally, it is 20-50 μm.

[U: Equal to or Less than 5 Ppb, Th: Equal to or Less than 5 Ppb]

As described in the column of the Ag ball, U and Th are the radioactive elements. It is required to reduce the content thereof in the solder plating film in order suppress the soft error. The content of U and Th should be equal to or less than 5 ppb respectively such that the alpha dose of the solder plating film is equal to or less than 0.0200 cph/cm². It is preferable that the content of U and Th is equal to or less than 2 ppb respectively from the viewpoint of the soft error suppression in the current or future high-density mounting.

[Alpha Dose: Equal to or Less than 0.0200 Cph/Cm²]

The alpha dose of the Ag core ball according to the present invention is equal to or less than 0.0200 cph/cm² similarly to the Ag ball. This level of the alpha dose does not affect the soft error problem in the high density mounting of the electronic components. The alpha dose of the Ag core ball according to the present invention is accomplished by two facts. The first is that the alpha dose of the Ag ball constituting the Ag core ball is equal to or less than 0.0200 cph/cm² as described hereinbefore. The second is that the alpha dose of the solder plating film constituting the Ag core ball is equal to or less than 0.0200 cph/cm².

The solder plating film of the present invention is formed at 100° C. at the highest. Thus, it is difficult to imagine that the content of the radioactive elements and isotopes is reduced by the vaporization of the radioactive elements such as U, Th, Po, etc. and the radioactive isotopes such as $^{210}$Bi, $^{210}$Pb, etc. However, if the plating is executed by flowing the plating solution and the Ag ball, U, Th, Po, $^{210}$Pb and $^{210}$Bi form the salt in the plating solution and deposit. The deposited salt is electrically neutral and the salt does not enter the solder plating film even if the plating solution flows.

The content of such elements and isotopes is significantly reduced in the solder plating film. Since the Ag core ball of the present invention is coated with such solder plating film, its alpha dose is low. The alpha dose is preferably equal to or less than 0.0020 cph/cm², more preferably equal to or less than 0.0010 cph/cm².

If the purity of the solder plating film constituting the Ag core ball of the present invention is higher, i.e., the content of the impurities is lower, then the content of the radioactive elements and isotopes is reduced and the alpha dose is reduced. Therefore, there is no lower limit of the impurities. On the other hand, the upper limit is preferably equal to or less than 150 ppm, more preferably equal to or less than 100 ppm, further preferably equal to or less than 50 ppm and most preferably equal to or less than 10 ppm from the viewpoint of the reduction of the alpha dose.

In a case that the solder plating film is the Sn solder, the purity of the solder plating film is based on the total content of the impurities in the solder plating film excluding Sn. If the solder plating film is the solder alloy of Sn-3Ag-0.5Cu, the purity of the solder plating film is based on the content of the impurities in the solder plating film excluding Sn, Ag and Cu.

The impurities contained in the solder plating film are Sb, Fe, As, In, Ni, Pb, Au, U, Th, etc. in a case of the Sn solder plating film.

It is preferable that the content of Bi is little especially in the impurities contained in the solder plating film. The Bi material contains a small an extremely small amount of $^{210}$Bi as the radioactive isotope. Therefore, it is conceivable that the alpha dose of the solder plating film is reduced significantly by reducing the content of Bi. The content of Bi in the solder plating film is preferably equal to or less than 15 ppm, more preferably equal to or less than 10 ppm and most preferably 0 ppm.

According to the Ag core ball of the present invention, the surface of the Ag ball is coated previously with a plating layer of another metal before forming the solder plating film. Especially if the surface of the Ag ball is coated previously with a Ni playing layer, a Co plating layer, etc., then the amount of Ag that is eluted to the solder plating film can be reduced. Therefore, the Ag thinning in the Ag ball can be suppressed. The metal constituting the plating layer is not limited to a single kind of metal and may be an alloy of a combination of at least two elements selected from Ni, Co and the like. A film thickness of the plating layer is generally 0.1-20 μm at a single side.

As for a diameter of the Ag core ball according to the present invention, if the diameter of the Ag core ball is, for example, about 1-300 μm, then an aggregate of the "Ag core balls" may be called "Ag core powder". The "Ag core powder" is the aggregate of many Ag core balls each having the aforementioned characteristic. The Ag core powder is distinguished from a single Ag core ball in usage wherein, for example, the Ag core powder is mixed as a powder in the solder paste. Similarly, in a case that the Ag core ball is used for forming the solder bump, it is treated as an aggregate. Therefore, in such usage, the "Ag core powder" is distinguished from the single Ag core ball.

One example of a manufacturing method for the Ag ball according to the present invention will be described herein after. In this invention, an atomizing method is that the Ag material is melt with a high temperature, the molten Ag in the liquid form is jetted at a high speed from a nozzle and it is cooled so as to spheronize the Ag ball. In particular, a gas atomizing method or the like is applied when using gas as a medium for jetting the molten Ag at the high speed from the nozzle.

Another atomizing method is that the molten Ag is fallen in drops from an orifice and the droplet is cooled to spheronize the Ag ball. The Ag ball spheronized by each atomizing method may be treated with a reheating process at 800-1,000° C. for 30-60 minutes.

In the method of manufacturing these Ag balls, the Ag material may be treated by the preheating process at 800-1,000° C. before spheronizing the Ag balls.

The Ag material for the raw material of the Ag ball may be a chip, a flake, a plate material and the like. The purity of the Ag material may be 3N-4N from the viewpoint of preventing the purity of the Ag ball from decreasing too much.

When using such Ag material having the high purity, the aforementioned heating process may be deleted and a holding temperature of the molten Ag may be reduced to about 1,000° C. similarly to the convention method. As discussed hereinbefore, the aforementioned heating process may be arbitrarily deleted or modified in accordance with the purity and the alpha dose of the Ag material. When manufacturing the Ag ball having the high alpha dose or the variant Ag ball, such Ag ball can be reused as the raw material and its alpha dose can be reduced.

An example method of manufacturing the Ag core ball according to the present invention will be discussed hereinafter. There are some methods of forming the plating film on the Ag ball by flowing the plating solution and the Ag ball manufactured as described hereinbefore. One of them is an electrolytic plating method such as a well-known barrel plating method. Another method generates a turbulent flow of the plating solution in a plating bath by a pump connected to the plating bath and forms the plating film on the Ag ball with the turbulent flow of the plating solution. An additional method provides a vibration plate in the plating bath, vibrates the vibration plate at a predetermined frequency, stirs the plating solution with the high-speed turbulent flow, and forms the plating film on the Ag ball with the turbulent flow of the plating solution.

One example method will be described wherein it forms a Sn—Ag—Cu solder plating film having its film thickness of 20 μm (single side) on the Ag ball having its diameter of 100 μm to make the Ag core ball having its diameter of about 140 μm.

The Sn—Ag—Cu contained plating solution of one embodiment according to the present invention contains, as essential components, a water base medium, sulfonic acid derivatives and metal components Sn, Ag and Cu.

The metal components in the soldering solution exist as Sn ion ($Sn^{2+}$ and/or $Sn^{4+}$), Ag ion ($Ag^+$) and Cu ion ($Cu^+$ and/or $Cu^{2+}$). The plating solution is obtained by mixing a mother liquid consisting of mainly water and sulfonic acid derivatives with the metallic compounds. It contains preferably an organic complexing agent in order to stabilize the metallic ions.

Examples of the metallic compounds in the plating solutions are as follows:

Examples of Sn compound are tin salt of organic sulfonic acid such as methane sulfonic acid, ethane sulfonic acid, 2-propanol sulfonic acid, p-phenol sulfonic acid, etc.; and stannous compound such as tin sulfate, stannous oxide, tin nitrate, tin chloride, tin bromide, tin iodide, tin phosphate, tin pyrophosphate, tin acetate, tin formate, tin citrate, tin gluconate, tin tartrate, tin lactate, tin succinate, tin sulfamate, tin borofuoride, tin silicofluoride, etc. These Sn compounds can be used by a single compound or a mixture of at least two compounds.

Examples of the Cu compound are copper salt of the aforementioned organic sulfonic acid, copper sulfate, copper oxide, copper nitrate, copper chloride, copper bromide, copper iodide, copper phosphate, copper pyrophosphate, copper acetate, copper formate, copper citrate, copper gluconate, copper tartrate, copper lactate, copper succinate, copper sulfamate, copper borofuoride, copper silicofluoride, etc. These Cu compounds can be used by a single compound or a mixture of at least two compounds.

Examples of the Ag compound are silver salt of the aforementioned organic sulfonic acid, silver sulfate, silver oxide, silver chloride, silver nitrate, silver bromide, silver iodide, silver phosphate, silver pyrophosphate, silver acetate, silver formate, silver citrate, silver gluconate, silver tartrate, silver lactate, silver succinate, silver sulfamate, silver borofuoride, silver silicofluoride, etc. These Ag compounds can be used by a single compound or a mixture of at least two compounds.

When forming the Sn—Ag—Cu solder plating film having its film thickness (single side) of 20 μm on the Ag ball having its diameter of 100 μm, the electric quantity of about 0.0108 coulomb is required.

The blending quantity of each metal in the plating solution is 0.21-2 mol/L, preferably 0.25-1.00 mol/L for $Sn^{2+}$; 0.01-0.1 mol/L, preferably 0.02-0.05 mol/L for $Ag^+$; and 0.002-

0.02, preferably 0.003-0.01 mol/L for $Cu^{2+}$. Since only $Sn^{2+}$ affects the plating, the quantity of $Sn^{2+}$ is adjusted in the present invention.

An ion concentration of Ag to that of Cu (Ag/Cu molar ration) is preferably within a range of 4.55-5.58. In this range, the Sn—Ag—Cu plating film having the low melting point such as the Sn-3Ag-0.5Cu alloy can be formed.

According to the following expression (1) based on Faraday's law of electrolysis, a precipitation amount of the desired solder plating is estimated. Then, an electric quantity is calculated, and a current is applied to the plating solution so as to produce the calculated electric quantity. The plating treatment is performed by the flowage of the Ag ball and the plating solution. A size of the plating bath is determined in accordance with the total volume of the Ag ball and the plating solution.

$$w(g)=(I \times t \times M)/(Z \times F) \quad \text{Expression (1)}$$

In the expression (1), w represents an electrolysis precipitation amount (g), I represents a current (A), t represents a current applying time (second), M represents an atomic weight of an element to be precipitated (118.71 for Sn), Z represents an atomic valence (bivalent for Sn) and F represents Faraday's constant (96,500 coulomb). The electric quantity Q (A×second) is (I×t).

According to the present invention, the plating process is performed while flowing the Ag ball and the plating solution. However, the flowing method is not limited. For example, the barrel electrolysis plating method may be used wherein a barrel rotates to flow the Ag ball and the plating solution.

The Ag core ball of the present invention is obtained after drying it in an atmospheric air or $N_2$.

Embodiments of the Ag ball according to the present invention will be described hereinafter; however, this invention is not limited only to them.

Embodiment 1

The Ag chip material having the purity equal to or more than 3N (99.9%) but equal to or less than 4N7 (99.997%) (alpha dose: 0.0051 cph/$cm^2$, U: <0.2 ppb, Th: <0.2 ppb) was put in a crucible and was preheated at 1,000° C. for 45 minute. After that, by using a gas atomizing method, the molten Ag in liquid form was jetted from a nozzle at a high-speed at a jetting temperature of 1,300° C., preferably 1,400° C. and then the misty molten Ag was cooled to spheronize the Ag ball. This process produced the Ag ball having an average grain diameter of 50 μm. Table 1 in FIG. 4 represents an element analysis result, an alpha dose and a sphericity of the produced Ag ball. The element analysis was executed with a high-frequency inductively-coupled plasma mass spectrometry (ICP-MS analysis) for U and Th and a glow discharge mass spectrometry (GD-MS analysis) for the other elements. A method of measuring the alpha dose and the sphericity will be explained in detail hereinafter.

[Alpha Dose]

An alpha-ray measurement instrument of a gas-flow proportional counter was used to measure the alpha dose. A measurement sample was the Ag balls that were bedded on a bottom of a low-depth vessel having a flat bottom of 300 mm×300 mm. This measurement sample was put in the alpha-ray measurement instrument and was remained in an atmosphere of PR-10 gas flow for 24 hours. Then, the alpha dose was measured. The PR-10 gas (argon 90% and methane 10%) used for the measurement was one that a gas bottle filled with the PR-10 gas was kept for a period equal to or longer than three weeks. A reason why using the gas bottle kept for the period equal to or longer than three weeks is based on JESD221 of JEDEC STANDARD-Alpha Radiation Measurement in Electronic Materials determined by JEDEC (Jint Electron Device Engineering Council) not so as to produce the alpha-ray by radon in the atmospheric air that enters into the gas bottle.

[Sphericity]

The sphericity was measured by using a CNC image measurement system. The sphericity in the present invention is an arithmetic mean value calculated by dividing a diameter (a length of a shortest axis) of each of 500 Ag balls by a length of the longest axis thereof. The closer to the upper limit 1.00, the closer to the true sphere. In this invention, the length of the diameter and the length of the longest axis are values measured by the ultra-quick vision model ULTRA QV 350-PRO manufactured by Mitsutoyo Corporation.

FIG. 1 shows a SEM photograph of the produced Ag ball. A magnification ratio of this SEM photographs is 1,500 times.

Embodiment 2

Figure 2:
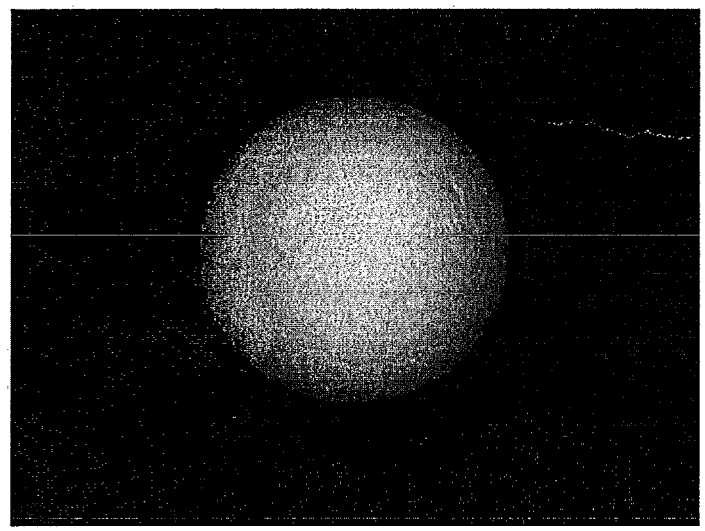
FIG. 2 shows a SEM photograph of an Ag ball of a second embodiment according to the present invention.

The Ag ball was produced and the element analysis and the alpha dose measurement were executed by the same process of the embodiment 1 except of using the Ag chip material having the purity more than 4N7 (99.997%) but equal to or less than 5N5 (99.9995%) (alpha dose: 0.0028 cph/$cm^2$, U: <0.2 ppb, Th: <0.2 ppb). Table 1 in FIG. 4 shows this result. FIG. 2 shows a SEM photograph of the Ag ball produced in the embodiment 2. A magnification ratio of this SEM photographs is 1,500 times.

Comparison Example 1

Figure 3:
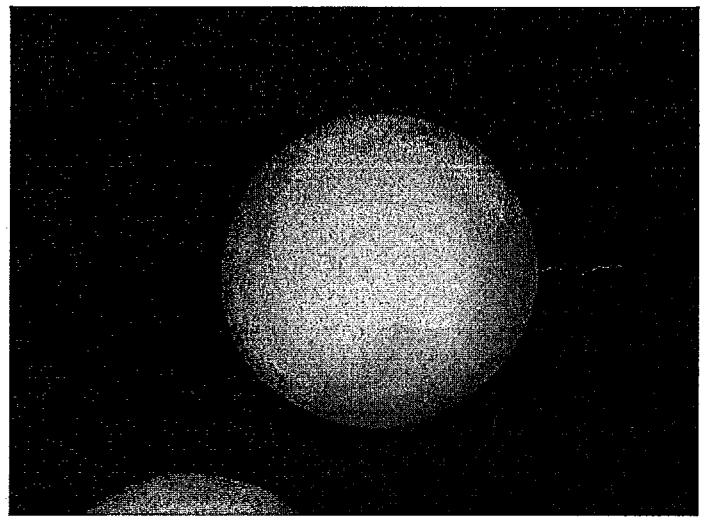
FIG. 3 shows a SEM photograph of an Ag ball of a third embodiment according to the present invention.

The Ag ball was produced and the element analysis and the alpha dose measurement were executed by the same process of the embodiment 1 except of using the Ag chip material having the purity more than 5N5 (alpha dose: <0.0010 cph/$cm^2$, U: <0.2 ppb, Th: <0.2 ppb). Table 1 in FIG. 4 shows this result. FIG. 3 shows a SEM photograph of the Ag ball produced in the comparison example 1. A magnification ratio of this SEM photographs is 1,500 times. In Table 1, units for each of embodiments and the comparison example are mass ppb for U and Th and mass ppm for the other elements.

As shown in Table 1, the purities of the Ag ball of the embodiments 1 and 2 were equal to or less than 5N5 and the contents of Bi and Pb were equal to or more than 1 ppm; however, their alpha doses were less than 0.0010 cph/$cm^2$. Since the purity of the Ag ball of the comparison example 1 was more than 5N5, its alpha dose was less than 0.0010 cph/$cm^2$ as a matter of course. The alpha doses of the Ag balls of the embodiments 1 and 2 were less than 0.0010 cph/$cm^2$ for at least two years. Therefore, the Ag balls of the embodiments 1 and 2 resolved the recent problem that the alpha dose was increasing with the aged deterioration.

In the Ag balls shown in FIGS. 1 and 2 and the embodiment 2, its impurity was less than 5N5, the content of elements excluding Ag was equal to or more than 5 ppm. Therefore, as shown in Table 1 of FIG. 4, each sphericity was equal to or more than 0.90 and this example shown a value equal to or more than 0.95. On the other hand, in the Ag ball of the comparison example 1 shown in FIG. 3, the purity was more than 5N5 and the content of elements excluding Ag was less than 5 ppm so that the sphericity was less than 0.90.

Embodiment 3

The Ag core ball was produced by forming the solder plating film for the Ag ball manufactured in the embodiment 1 under the following condition wherein the solder plating film contained Sn as its principal component.

The Ag core ball was treated with the plating process by using the following plating solution under the electric quantity of about 0.0038 coulomb so as to coating the Ag ball having the diameter of 50 μm with the solder plating film having the film thickness (single side) of 20 μm. After this treatment, it was dried in the atmosphere to obtain the Ag core ball. A cross-section of the Ag core ball coated with the solder plating film was observed by the SEM photograph to find the film thickness of about 40 μm.

The solder plating solution was produced as follows. All 54-weight-percent solution of methane sulfonic acid in water was mixed with one third of water necessary for adjusting the plating solution. Then, acetyl cysteine was added wherein the acetyl cysteine is an example of mercaptan compound as complexing. After confirming the dissolution, 2,2-ditiodianiline was added wherein 2,2-ditiodianiline is one example of aromatic amino compound as another type of complexing. When the mixture became light blue gel solution, methane sulfonic acid stannous was rapidly added thereto.

Then two third of water necessary for the plating solution was added. Finally, 3 g/L of alpha-naphtol polyethoxylate (EO10 mol) was added to complete the adjustment of the plating solution wherein alpha-naphtol polyethoxylate is an example of surface acting agent. Then, the plating solution was produced wherein a density of the methane sulfonic acid was 2.64 mol/L and that of tin ion was 0.337 mol/L. Methane sulfonic acid stannous used in this example was produced from a Sn sheet material as a raw material wherein the Sn sheet will be discussed.

An element analysis of the solder plating film formed on the surface of the Ag core ball was executed and an element analysis of the Sn sheet material as a raw material of the solder plating solution was executed. In the analysis, a high-frequency inductively-coupled plasma mass analysis (ICP-MS analysis) was used for U and Th and a high-frequency inductively-coupled plasma emission spectrochemical analysis (ICP-AES analysis) was used for the other elements. The alpha dose of the Sn sheet material was measured similarly to the measurement for the Ag ball except that the sheet material was overlaid on the vessel having the flat bottom of 300 mm×300 mm. The alpha dose of the Ag core ball was measured similarly to the Ag ball measurement. The sphericity of the Ag core ball was measured under the same condition of the Ag ball measurement. These measurement results are shown in Table 2 of FIG. 5. In Table 2, units are mass ppb for U and Th and mass ppm for the other elements.

According to Table 2, the alpha does was more than 0.2 cph/cm$^2$ at the Sn sheet material stage but the alpha dose was less than 0.0010 cph/cm$^2$ in the embodiment 3 where the Ag ball was solder plated by using the Sn sheet material. It was verified that, in the Ag core ball of the embodiment 3, the alpha dose was reduced by forming the solder plating film by the plating method.

In the Ag core ball of the embodiment 3, the alpha dose did not increase two-year later after it was produced.

A flux layer may be formed on the surface of the Ag ball or the surface of the solder layer of the Ag core ball according to the present invention. The flux layer comprises one or plural kinds of composition for acting as an activator for preventing the metallic surface being oxidized and eliminating the metal-oxide film. The components of the flux layer adheres to the surface of the Ag ball or the Ag core ball in solid condition. Therefore, the flux layer may comprises the activator composition that adheres to the surface of the Ag ball or the Ag core ball in the solid condition, prevents the surface of the Ag ball or the Ag core ball being oxidized and removes the metallic oxide layer from the jointing target during the soldering operation. For example, the flux layer may comprises only one compound component that acts as the activator and adheres to the Ag ball or the Ag core ball.

One of amine, organic acid and halogen; a combination of plural kinds of amine; a combination of plural kinds of organic acid; a combination of plural kinds of halogen; or a combination of a single or plural kinds of amine, organic acid and halogen is added as the activator composing the flux layer in accordance with the characteristic required for the present invention.

The flux layer may comprise plural components including a compound of acting as the activator, another compound of acting as an active adjuvant and the like. The compound composing the flux layer, for example, the compound acting as the activator may be a compound that does not solidify by itself if it solidifies by mixing with another composite.

One of ester, amid and amino acid; a combination of plural kinds of ester; a combination of plural kinds of amid; a combination of plural kinds of amino acid; or a combination of a single or plural kinds of ester, amid and amino acid is added as the active adjuvant composing the flux layer in accordance with the characteristic of the activator.

The flux layer may include rosin and resin in order to protect the compound and the like of acting as the activator from the heat during the reflow process. In addition, the flux layer may include rosin for adhering the compound and the like of acting as the activator to the Ag ball or the Ag core ball.

In general, a color of the flux is different from that of the metal and a color of the Ag ball is different from that of the flux layer. Therefore, the adsorbed amount of the flux can be confirmed from the color degree, for example, luminance, yellow chromaticity and red chromaticity. A pigment may be mixed with the compound of composing the flux layer for coloring.

[Composition of Flux Layer]

For amine, compounds represented by aliphatic amine, aromatic amine and imidazole derivatives are added. Such additive is one amine or a combination of plural amines selected from a group consisting of aminopropane, aminobutane, aminopentane, aminohexene, aminocyclohexane, aniline, aminoheptane, methylaniline, aminooctane, dimethylaniline, ethylaniline, aminononane, aminodecane, aminoundecane, aminododecane, aminotridecane, aminotetradecane, aminopentadecane, aminohexadecane, aminoheptadecane, aminooctadecane, aminononadecane, aminoicosane, triphenylamine, pyridine, methylpyridine, dimethylpyridine, tirimethylpyridine, ethylpyridine, propylpyridine, phenylpyridine, methylphenylpyridine, ethylphenylpyridine, phenylpropylpyridine, diphenylpyridine, benzilpyridine, methylbenzilpyridine, ethylbenzilpyridine, propylbenzilpyridine, phenylbenzilpyridine, ethylendiamine, propylendiamine, diaminobutane, diaminopentane, diaminohexene, diaminocyclohexene, phenyldiamine, diaminoheptan, diaminoheptane, diaminooctane, diaminononane, diaminodecane, diaminoundecane, diaminododecane, diaminotridecane, diaminotetradecane, diaminopentadecane, diaminohexadecane, diaminoheptadecane, diaminooctadecane, diaminononadecane, diaminoicosane, pyridazine, pyrimidine, pyrazine, bipyridine, imidazole, 2-methylimidazole, 2-undecylimidazole, 2-heptadecylimidazole, 1,2-dimethylimidazole, 2-ethyl-4-methylimidazole, 2-phenylimidazole, 2-phenyl-4-methylimidazole, 1-benzil-2-methylimidazole, 1-benzil-2-phenylimidazole, 1-cyanoethyl-2-methylimidazole, 1-cyanoethyl-2-undecylimidazole, 1-cyanoethyl-2-ethyl-4-methylimidazole, 1-cyanoethyl-2-phenylimidazole, 1-cyanoethyl-2-undecylimidazoliumtrimeritate, 1-cyanoethyl-2-phenylimidazoliumtrimeritate, 2,4-diamino-6-[2'-methylimidazolyl-(1')]-ethyl-s-triazine, 2,4-diamino-6-[2'-ethyl-4'-methylimidazolyl-(1')]-ethyl-s-triazine, 2,4-diamino-6-[2'-methylimidazolyl-(1')]-ethyl-s-triazine isocyanuric acid adduct, 2-phenylimidazole isocyanuric acid adduct, 2-phenyl-4,5-dihydroxymethylimidazole, 2-phenyl-4-methyl-5-hydroxymethylimidazole, 2,3-dihydro-1H-pyrrolo[1,2-a]benzimidazole, 1-dodecyl-2-methyl-3-benzilimidazoliumchloride, 2-methylimidazoline, 2-phenylimidazoline, 2,4-diamino-6-vinyl-s-triazine, 2,4-diamino-6-vinyl-s-triazine isocyanuric acid adduct, and 2,4-diamino-6-methacrylyloxyethyl-s-triazine.

For amine halogen salt, one or a combination of the aforementioned HF salt, $HBF_4$ salt, HCl salt, HBr salt and HI salt is added.

For organic acid, compounds represented by aliphatic carboxylic acid and aromatic carboxylic acid are added. Such additive is one organic acid or a combination of plural organic acids selected from a group consisting of formic acid, acetic acid, propionic acid, butyric acid, valeric acid, caproic acid, enanthic acid, caprylic acid, pelargonic acid, capric acid, lauric acid, myristic acid, palmitic acid, stearic acid, arachic acid, behenic acid, oxalic acid, malonic acid, succinic acid, phenyl succinic acid, glutaric acid, adipic acid, pimelic acid, suberic acid, azelaic acid, sebacic acid, fumaric acid, maleic acid, tartaric acid, malic acid, levulinic acid, lactic acid, acrylic acid, benzoic acid, salicylic acid, anisic acid, citric acid, glycolic acid, diglycol acid, hydroxypropionic acid, dihydroxypropionic acid, hydroxybutyric acid, dihydroxybutyric acid, hydroxy valeric acid, dihydroxyvaleric acid, hydroxycaproic acid, dihydroxycaproic acid, hydroxyenanthic acid, dihydroxyenanthic acid, hydroxycaprylic acid, dihydroxycaprylic acid, hydroxypelargonic acid, dihydroxypelargonic acid, hydroxycapric acid, dihydroxycapric acid, hydroxylauric acid, dihydroxylauric acid, hydroxymyristic acid, dihydroxymyristic acid, hydroxypalmitic acid, dihydroxypalmitic acid, hydroxystearic acid, hydroxyarachic acid, dihydroxypalmitic acid, hydroxybehenic acid, dihydroxybehenic acid, hydroxymethylpropionic acid, dihydroxymethylpropionic acid, hydroxymethybutryric acid, dihydroxymethybutryric acid, hydroxymethylvaleric acid, dihydroxymethylvaleric acid, hydroxymethylcaproic acid, dihydroxymethylcaproic acid, hydroxymethylenanthic acid, dihydroxymethylenanthic acid, hydroxymethylcaprylic acid, dihydroxymethylcaprylic acid, hydroxymethylpelargonic acid, dihydroxymethylpelargonic acid, hydroxymethylcapric acid, dihydroxymethylcapric acid, hydroxymethyllauric acid, dihydroxymethyllauric acid, hydroxymethylmyristic acid, dihydroxymethylmyristic acid, hydroxymethylpalmitic acid, dihydroxymethylpalmitic acid, hydroxymethylstearic acid, hydroxymethylarachic acid, dihydroxymethylarachic acid, hydroxymethylbehenic acid, and djihydroxymethylbehenic acid.

For organic acid amine salt, the aforementioned any organic acid and amine salt or a combination thereof is added.

For halogen, compounds represented by alkyl halide, aryl halide, alkyl halide alcohol and aryl halide alcohol are added. Such additive is one halogen or a combination of plural halogens selected from a group consisting of chloromethane, chloroethane, chloropropane, chlorobutane, chloropentane, chlorohexene, chloroheptane, chlorooctane, chlorononane, chlorodecane, chloroundecane, chlorododecane, chlorotridecane, chlorotetradecane, chloropentadecane, chlorohexadecane, chloroheptadecane, chlorooctadecane, chlorononadecane, chloroicosane, chlorocyclohexene, chlorobenzene, chlorotoluene, dichloromethane, dichloroethane, dichloropropane, dichlorobutane, dichloropentane, dichlorohexene, dichloroheptane, dichlorooctane, dichlorononane, dichlorodecane, dichloroundecane, dichlorododecane, dichlorotridecane, dichlorotetradecane, dichloropentadecane, dichlorohexadecane, dichloroheptadecane, dichlorooctadecane, dichlorononadecane, dichloroicosane, dichlorocyclohexene, dichlorobenzene, dichloroxylene, trichloromethane, trichloroethane, trichloropropane, trichlorobutane, trichloropentane, trichlorohexene, trichloroheptane, trichlorooctane, trichlorononane, trichlorodecane, trichloroundecane, trichlorododecane, trichlorotridecane, trichlorotetradecane, trichloropentadecane, trichlorohexadecane, trichloroheptadecane, trichlorooctadecane, trichlorononadecane, trichloroicosane, trichlorocyclohexene, trichlorobenzene, trichloromesitylene, bromomethane, bromoethane, bromopropane, bromobutane, bromopentane, bromohexene, bromoheptane, bromooctane, bromononane, bromodecane, bromoundecane, bromododecane, bromotridecane, bromotetradecane, bromopentadecane, bromohexadecane, bromoheptadecane, bromooctadecane, bromononadecane, bromoicosane, bromocyclohexene, bromobenzene, bromotoluene, dibromomethane, dibromoethane, dibromopropane, dibromobutane, dibromopentane, dibromohexene, dibromoheptane, dibromooctane, dibromononane, dibromodecane, dibromoundecane, dibromododecane, dibromotridecane, dibromotetradecane, dibromopentadecane, dibromohexadecane, dibromoheptadecane, dibromooctadecane, dibromononadecane, dibromoicosane, dibromocyclohexene, dibromobenzene, dibromoxylen, tribromomethane, tribromoethane, tribromopropane, tribromobutane, tribromopentane, tribromohexene, tribromoheptane, tribromooctane, tribromononane, tribromodecane, tribromoundecane, tribromododecane, tribromotridecane, tribromotetradecane, tribromopentadecane, tribromohexadecane, tribromoheptadecane, tribromooctadecane, tribromononadecane, tribromoicosane, tribromocyclohexene, tribromobenzene, tribromomesitylene, iodomethane, iodoethane, iodopropane, iodobutane, iodopentane, iodohexene, iodoheptane, iodooctane, iodononane, iodododecane, iodoundecane, iodododecane, iodotridecane, iodotetradecane, iodopentadecane, iodohexadecane, iodoheptadecane, iodooctadecane, iodononadecane, iodoicosane, iodocyclohexene, iodobenzene, iodotoluene, diiodomethane, diiodoethane, diiodopropane, diiodobutane, diiodopentane, diiodohexene, diiodoheptane, diiodooctane, diiodononane, diiododecane, diiodoundecane, diiodododecane, diiodotridecane, diiodotetradecane, diiodopentadecane, diiodohexadecane, diiodoheptadecane, diiodooctadecane, diiodononadecane, diiodoicosane, diiodocyclohexene, diiodobenzene, diiodoxylene, triiodomethane, triiodoethane, triiodopropane, triiodobutane, triiodopentane, triiodohexene, triiodoheptane, triiodooctane, triiodononane, triiododecane, triiodoundecane, triiodododecane, triiodotridecane, triiodotetradecane, triiodopentadecane, triiodohexadecane, triiodoheptadecane, triiodooctadecane, triiodononadecane, triiodoicosane, triiodocyclohexene, triiodobenzene, and triiodomesitylene.

Halogenated alcohol is one or a combination of plural ones selected from a group consisting of bromomethanol, dibromomethanol, tribromomethanol, bromoethanol, dibromoethanol, tribromoethanol, bromopropanol, dibromopropanol, tribromopropanol, bromobutanol, dibromobutanol, tribromobutanol, bromopentanol, dibromopentanol, tribromopentanol, bromohexanol, dibromohexanol, tribromohexanol, bromoheptanol, dibromoheptanol, tribromoheptanol, bromooctanol, dibromooctanol, tribromooctanol, bromononanol, dibromononanol, tribromononanol, bromodecanol, dibromodecanol, tribromodecanol, chloromethanol, dichloromethanol, trichloromethanol, chloroethanol, dichloroethanol, trichloroethanol, chloropropanol, dichloropropanol, trichloropropanol, chlorobutanol, dichlorobutanol, trichlorobutanol, chloropentanol, dichloropentanol, trichloropentanol, chlorohexanol, dichlorohexanol, trichlorohexanol, chloroheptanol, dichloroheptanol, trichloroheptanol, chlorooctanol, dichlorooctanol, trichlorooctanol, chlorononanol, dichlorononanol, trichlorononanol, chlorodecaneol, dichlorodecaneol, trichlorodecaneol, iodomethanol, diiodomethanol, triiodomethanol, iodoethanol, diiodoethanol, triiodoethanol, iodopropanol, diiodopropanol, triiodopropanol, iodobutanol, diiodobutanol, triiodobutanol, iodopentanol, diiodopentanol, triiodopentanol, iodohexanol, diiodohexanol, triiodohexanol, iodoheptanol, diiodoheptanol, triiodoheptanol, iodooctanol, diiodooctanol, triiodooctanol, iodononanol, diiodononanol, triiodononanol, iododecanol, diiododecanol, triiododecanol, bromomethandiol, dibromomethandiol, bromoethandiol, dibromoethandiol, tribromoethandiol, bromopropandiol, dibromopropandiol, tribromopropandiol, bromobutandiol, dibromobutandiol, tribromobutandiol, bromopentandiol, dibromopentandiol, tribromopentandiol, bromohexandiol, dibromohexandiol, tribromohexandiol, bromoheptandiol, dibromoheptandiol, tribromoheptandiol, bromooctandiol, dibromooctandiol, tribromooctandiol, bromonondiol, dibromononandiol, tribromononandiol, bromodecandiol, dibromodecandiol, tribromodecandiol, chloromethandiol, dichloromethandiol, chloroethandiol, dichloroethandiol, trichloroethandiol, chloropropandiol, dichloropropandiol, trichloropropandiol, chlorobutandiol, dichlorobutandiol, trichlorobutandiol, chloropentandiol, dichloropentandiol, trichloropentandiol, chlorohexandiol, dichlorohexandiol, trichlorohexandiol, chloroheptandiol, dichloroheptandiol, trichloroheptandiol, chlorooctandiol, dichlorooctandiol, trichlorooctandiol, chlorononandiol, dichlorononandiol, trichlorononandiol, chlorodecandiol, dichlorodecandiol, trichlorodecandiol, iodomethandiol, diiodomethandiol, iodoethandiol, diiodoethandiol, triiodoethandiol, iodopropandiol, diiodopropandiol, triiodopropandiol, iodobutandiol, diiodobutandiol, triiodobutandiol, iodopentandiol, diiodopentandiol, triiodopentandiol, iodohexandiol, diiodohexandiol, triiodohexandiol, iodobutandiol, diiodobutandiol, triiodobutandiol, iodooctandiol, diiodooctandiol, triiodooctandiol, iodononandiol, diiodononadiol, triiodononandiol, iododecandiol, diiododecandiol, triiododecandiol, bromomethantriol, dibromomethantriol, bromoetantriol, dibromoetantriol, bromopropantriol, dibromopropantriol, tribromopropantriol, bromobutantriol, dibromobutantriol, tribromobutantriol, bromopentantriol, dibromopentantriol, tribromopentantriol, bromohexantriol, dibromohexantriol, tribromohexantriol, bromoheptantriol, dibromoheptantriol, tribromoheptantriol, bromooctantriol, dibromooctantriol, tribromooctantriol, bromononantriol, dibromononantriol, tribromononantriol, bromodecantriol, dibromodecantriol, tribromodecantriol, chloromethantriol, dichloromethantriol, chloroetantriol, dichloroetantriol, chloropropantriol, dichloropropantriol, trichloropropantriol, chlorobutantriol, dichlorobutantriol, trichlorobutantriol, chloropentantriol, dichloropentantriol, trichloropentantriol, chlorohexantriol, dichlorohexantriol, trichlorohexantriol, chloroheptantriol, dichloroheptantriol, trichloroheptantriol, chlorooctantriol, dichlorooctantriol, trichlorooctantriol, chlorononantriol, dichlorononantriol, trichlorononantriol, chlorodecantriol, dichlorodecantriol, trichlorodecantriol, iodomethantriol, diiodomethantriol, iodoethantriol, diiodoethantriol, iodopropantriol, diiodopropantriol, triiodopropantriol, iodobutantriol, diiodobutantriol, triiodobutantriol, iodopentantriol, diiodopentantriol, triiodopentantriol, iodohexantriol, diiodohexantriol, triiodohexantriol, iodoheptantriol, diiodoheptantriol, triiodoheptantriol, iodooctantriol, diiodooctantriol, triiodooctantriol, iodononantriol, diiodononantriol, triiodononantriol, iododecantriol, diiododecantriol, triiododecantriol, bromovinyl alcohol, dibromovinyl alcohol, bromoallyl alcohol, dibromoallyl alcohol, tribromoallyl alcohol, bromobutenol, dibromobutenol, tribromobutenol, bromopentenol, dibromopentenol, tribromopentenol, bromohexeneol, dibromohexeneol, tribromohexeneol, bromohepteneol, dibromohepteneol, tribromohepteneol, bromoocteneol, dibromoocteneol, tribromoocteneol, bromononeneol, dibromononeneol, tribromononeneol, bromodecaneol, dibromodecaneol, tribromodecaneol, chlorovinyl alcohol, dichlorovinyl alcohol, chloroallyl alcohol, dichloroallyl alcohol, trichloroallyl alcohol, chlorobuteneol, dichlorobuteneol, trichlorobuteneol, chloropentenol, dichloropentenol, trichloropentenol, chlorohexeneol, dichlorohexeneol, trichlorohexeneol, chlorohepteneol, dichlorohepteneol, trichlorohepteneol, chloroocteneol, dichloroocteneol, trichloroocteneol, chlorononeneol, dichlorononeneol, trichlorononeneol, chlorodecaneol, dichlorodecaneol, trichlorodecaneol, iodovinyl alcohol, diiodovinyl alcohol, iodoallyl alcohol, diiodoallyl alcohol, triiodoallyl alcohol, iodobuteneol, diiodobuteneol, triiodobuteneol, iodopenteneol, diiodopenteneol, triiodopenteneol, iodohexeneol, diiodohexeneol, triiodohexeneol, iodohepteneol, diiodohepteneol, triiodohepteneol, iodoocteneol, diiodoocteneol, triiodoocteneol, iodononeneol, diiodononeneol, triiodononeneol, iododecaneol, diiododecaneol, triiododecaneol, bromobutenediol, dibromobutenediol, tribromobutenediol, bromopentendiol, dibromopentendiol, tribromopentendiol, bromohexenediol, dibromohexenediol, tribromohexenediol, bromoheptenediol, dibromoheptenediol, tribromoheptenediol, bromooctenediol, dibromooctenediol, tribromooctenediol, bromononenediol, dibromononenediol, tribromononenediol, bromodecanediol, dibromodecanediol, tribromodecanediol, chlorobutenediol, dichlorobutenediol, trichlorobutenediol, chloropentenediol, dichloropentenediol, trichloropentenediol, chlorohexenediol, dichlorohexenediol, trichlorohexenediol, chloroheptenediol, dichloroheptenediol, trichloroheptenediol, chlorooctenediole, dichloroheptenediol, trichloroheptenediol, chlorononenediol, dichlorononenediol, trichlorononenediol, chlorodecanediol, dichlorodecanediol, trichlorodecanediol, iodobutenediol, diiodobutenediol, triiodobutenediol, iodopentenediol, diiodopentenediol, triiodopentenediol, iodohexenediol, diiodopentenediol, triiodopentenediol, iodoheptenediol, diiodoheptenediol, triiodoheptenediol, iodooctenediol, diiodooctenediol, triiodooctenediol, iodononenediol, diiodononenediol, triiodononenediol, iododecanediol, diiododecanediol, triiododecanediol, bromobutenetriol, dibromobutenetriol, tribromobutenetriol, bromopentenetriol, dibromopentenetriol, tribromopentenetriol, bromohexenetriol, dibromohexenetriol, tribromohexenetriol, bromoheptenediol, dibromoheptenediol, tribromoheptenediol, bromooctendiol, dibromooctendiol, tribromooctendiol, bromononenediol, dibromononenediol, tribromononenediol, bromodecanediol, dibromodecanediol, tribromodecanediol, chlorobutenetriol, dichlorobutenetriol, trichlorobutenetriol, chloropentenetriol, dichloropentenetriol, trichloropentenetriol, chlorohexenetriol, dichlorohexenetriol, trichlorohexenetriol, chlorohepenetriol, dichlorohepenetriol, trichlorohepenetriol, chlorooctenetriol, dichlorooctenetriol, trichlorooctenetriol, chlorononenetriol, dichlorononenetriol, trichlorononenetriol, chlorodecanetriol, dichlorodecanetriol, trichlorodecanetriol, iodobutenetriol, diiodobutenetriol, triiodobutenetriol, iodopentenetriol, diiodopentenetriol, triiodopentenetriol, iodohexenetriol, diiodohexenetriol, triiodohexenetriol, iodoheptenetriol, diiodoheptenetriol, triiodoheptenetriol, iodooctenetriol, diiodooctenetriol, triiodooctenetriol, iodononenetriol, diiodononenetriol, triiodononenetriol, iododecanetriol, deiododecanetriol and triiododecanetriol.

For ester, compounds represented by aliphatic carboxylic acid ester, aromatic carboxylic acid ester, aliphatic sulfonic acid ester and aromatic sulfonic acid ester are added. Such additive is one ester or a combination of plural esters selected from a group consisting of paratoluensulfonic acid propyl, paratoluensulfonic acid butyl, benzene sulfonic acid propyl, benzene-sulfonic acid butyl, salicylic acid propyl, salicylic acid butyl, 4-nitrobenzoic acid propyl, 4-nitrobenzoic acid butyl, methacrylic acid butyl, acrylic acid acrylate and malonic acid butyle.

Amide is one or a combination of plural ones selected from a group consisting of acetamide, propionic acid amide, butyric acid amide, valeric acid amide, caproic acid amide, enanthic acid amide, caprylic acid amide, pelargonic acid amide, capric acid amide, laurylic acid amide, myristate acid amide, palmitic acid amide, stearic acid amide, arachic acid amide, behenic acid amide, ethylene biscapric acid amide, methylene bisstearic acid amide, ethylene bisstearic acid amide, ethylene bishydroxystearic acid amide, ethylene bislauric acid amide, ethylene bisbehenic acid amide, hexamethylene bisstearic acid amide, hexamethylene bisbehenic acid amide, and hexamethylene bishydroxystearic acid amide.

Amino acid is one or a combination of plural ones selected from a group consisting of alanine, arginine, asparagine, asparagine acid, cysteine, glutamine, glutamic acid, glycine, histidine, isoleucine, leucine, lycine, methionine, phenylalanine, proline, serine, threonine, tryptophan, tyrosine, valine, cystine, hydroxyproline, hydroxylysine, thyroxine, o-phosphoserine, desmosine, beta ($\beta$) alanine, sarcosine, ornithine, creatine, gamma ($\gamma$) aminobutyric acid, opine, theanine, tricholomic acid, kainic acid, domoic acid, ibotenic acid, acromelic acid, and trimethylglycine.

Rosin is one or a combination of plural ones selected from a group consisting of modified rosin such as acrylic acid modified rosin, phenol modified rosin, maleic acid modified rosin, fumaric acid modified rosin, etc.; hydrogenated rosin; polymerized rosin; rosin ester; rosin amine; disproportionated rosin; and saponified rosin.

Resin is one or a combination of plural ones selected from a group consisting of phenol resin, vinyl butyral resin, epoxy resin, polyvinyl alcohol, polyvinylpyrrolidone, nylon resin, polyethylene glycol, polyamide resin, polyester resin, acrylate resin, polyethylene resin, polypropylene resin, polystyrene resin, polyethylene terephthalate resin, polyurethane resin, polyester resin and polyimide resin.

The aforementioned amine, halogen, organic acid, ester, amide, amino acid, rosin and resin are only examples of the flux material but the flux material is not limited to these compounds including these structural isomers, monosubstituted compounds, multisubstituted compounds, etc.

The flux layer may be configured by a single layer comprising a single or plural compounds. Moreover, the flux layer may be configured by multiple layers comprising plural compounds. The components of the flux layer adheres to the Ag ball or the Ag core ball in the solid state; however, the flux should be a liquid or gas state in the process of making the flux to adhere to the Ag ball or the Ag core ball.

Therefore, in a case that the coating process is performed in the liquid state, the components constructing the flux layer is required to be dissolved in the solvent. However, if it forms the salt, insoluble element exists in the solvent. Since there is the insoluble element in the liquid flux, a uniform absorption is difficult in the flux including low soluble components that form the depositions. Thus, in the past, it was impossible to form the liquid flux by mixing the compounds the form the salt.

On the other hand, according to the flux-coated Ag ball or the flux-coated Ag core ball of the embodiments of the present invention, the flux layer is formed layer-by-layer and solidified to form the multi-layer type flux layer. Therefore, even if the compounds of forming the salt are used and such compounds cannot be mixed with the liquid flux, it is possible to from the flux layer with using such compounds.

[Solderability of Flux-Coated Ag Core Ball]

The flux-coated Ag core ball was produced by using the Ag core ball of the embodiment 3 having the desired sphericity and the alpha dose and then the solderability was verified by using this flux-coated Ag core ball.

(1) Composition of Flux

Produced fluxes comprise the composition shown in Table 3 of FIG. 6. A composition of a flux (1C) is that 5 weight % thereof is the stearic acid of the organic acid as the activator, 5 weight % thereof is the rosin ester for the rosin and the remainder or 90 weight % thereof is the isopropylalcohol as the solvent.

A composition of a flux (2C) is that 5 weight % thereof is the 2-phenylimidazole of the amine as the activator, 5 weight % thereof is the hydrogenated rosin for the rosin and the remainder or 90 weight % thereof is isopropylalcohol as the solvent.

A composition of a flux (3C) is that 10 weight % thereof is the sebacic acid of the organic acid as the activator and the remainder or 90 weight % thereof is isopropylalcohol as the solvent. A composition of a flux (4C) is that 10 weight % thereof is trans-2,3-dibromo-2-butene-1,4-diol of one kind of the dibromobutenediol of the halogen as the activator and the remainder or 90 weight % thereof is isopropylalcohol as the solvent.

(2) Production of Flux-Coated Ag Core Ball

A flux-coated Ag core ball described in the following description was produced by using the Ag core ball of the embodiment 3 having the desired sphericity and the alpha dose and using the flux of the aforementioned Table 3 in FIG. 6. For the flux-coated Ag core ball of the embodiment 1D, the Ag core balls of the embodiment 3 were dipped in the flux (10) of Table 3 and then the Ag balls were spread in a metallic vessel for drying them with hot air.

For the flux-coated Ag core ball of the embodiment 2D, the Ag core balls of the embodiment 3 were dipped in the flux (2C) of Table 3 and then the Ag balls were spread in the metallic vessel for drying them with hot air. For the flux-coated Ag core ball of the embodiment 3D, the Ag core balls of the embodiment 3 were dipped in the flux (3C) of Table 3 and then the Ag balls were spread in the metallic vessel for drying them with hot air. For the flux-coated Ag core ball of the embodiment 4D, the Ag core balls of the embodiment 3 were dipped in the flux (4C) of Table 3 and then the Ag balls were spread in the metallic vessel for drying them with hot air. The comparison example 1D was the Ag core ball not coated with the flux.

(3) Verification of Solderability

The flux-coated Ag core balls coated with the flux in the embodiments and the Ag core ball not coated with the flux were spread on the Cu plate. They were reflowed on a hotplate in the atmospheric air at 250° C. for 30 seconds.

It was checked if joint objects were formed or not wherein the joint objects would be obtained on the Cu plate. For verifying the solderability, the Cu plate was positioned vertically upper a desk and it was dropped down from a hand at a height of about 5 cm to the desk wherein the Cu plate had the reflowed flux-coated Ag core balls of the embodiments and the reflowed Ag core ball of the comparison example.

A good (OK) determination was that the joint object was bound to the Cu plate with the solder and did not remove the Cu plate. A bad (NG) determination was that the joint object removed from the Cu plate. The solderability can be verified by determining if the joint object removes from the Cu plate when rubbing the object with fingers, wearing it by washing the Cu plate with wash fluid (IPA, etc.) or washing it. A Cu substrate was the joint object for confirming the solderability. The Cu substrate was the joint target for confirming the joint. The Cu substrate may be treated by a preflux process called OSP (Organic Solderability Preservative) process. In this example, a Cu-OSP substrate was used.

The solderability was verified for the Ag plating Cu substrate as a joint target, too. A method of producing a sample was the same as the verification using the Cu substrate except using the Cu substrate plated with Ag. A judgment criterion of the same was similar to that of the Cu plate.

As shown in Table 4 illustrated by FIG. 7, for the flux-coated Ag core balls of the embodiments 1D, 2D, 3D and 4D that were coated with the flux, the joint object obtained by the reflow process did not remove from the joint target regardless of a fact that the joint target was the Cu-OSP substrate or the Ag plated Cu plate.

On the other hand, for the Ag core ball of the comparison example 1 that was not coated with the flux, the joint object obtained by the reflow process removed from the joint target. It might be conceivable that the solder junction was not formed because the oxidized film was not removed. From the above-description, it is found that the solderability of the flux-coated Ag core ball is improved in comparison with the Ag core ball.

After producing the flux-coated Ag ball and the Ag core ball, they can be separated by reference to the amount of the coating flux with a separation process by using a screen or the like. Therefore, the Ag ball can satisfy both of the wettability of the solder paste used for the joint with the electrodes and the fluidity of the flux-coated Ag ball. The Ag core ball can satisfy both of the wettability of the solder for the electrodes and the fluidity of the flux-coated Ag core ball.

The alpha doses of the flux-coated balls of all the embodiments according to the present invention were measured and the results were equal to or less than 0.0010 cph/cm$^2$ that was less than the required 0.0200 cph/cm$^2$.

In a method of using the Ag ball or the Ag core ball of the present invention, the solder paste may be applied on the electrodes and then the Ag ball or the Ag core ball is provided directly on the paste to joint them. In addition, the Ag ball or the Ag core ball of the invention may be used for the formed solder or the like where the Ag balls or the Ag core balls are dispersed in the solder. Moreover, the Ag ball or the Ag core ball may be kneaded with the solder powder and the flux to make the paste that previously contains the Ag ball or the Ag core ball. In this case, at least two kinds of solder powders having different compositions and grain diameters may be added simultaneously.

The Ag ball of the present invention may be kneaded with polymer binder and solvent to form the Ag paste. The polymer binder may comprise epoxy acrylate, acrylic resin, epoxy resin, phenol resin, polyester resin, polyimide, polyvinyl acetate, etc. The solvent may comprise butylcellosolveacetate, benzyl alcohol, ethyl acetate, methyl ethyl ketone, butyl carbitol, etc.

When using them with the aforementioned methods, there is no limitation in the composition of the solder paste and the formed solder alloy and the composition of the solder powder for the solder pate that are used with the Ag ball or the Ag core ball. However, it is preferable that the alpha dose is equal to or less than 0.0200 cph/cm$^2$.

Although various embodiments, which incorporate the techniques of the present invention, have been shown and described in detailed herein, those skilled in the art will readily understand that many other varied embodiments may be incorporated using these techniques, and all are intended to lie within the scope of the following claims.

What is claimed is:

1. An Ag ball, comprising:
    an element U, a content thereof being equal to or less than 5 ppb; and
    an element Th, a content thereof being equal to or less than 5 ppb;
    wherein a purity of said Ag ball is equal to or more than 99.9% but equal to or less than 99.9995%;
    an alpha dose of said Ag ball is equal to or less than 0.0200 cph/cm$^2$;
    a content of either Pb or Bi or a total content of both Pb and Bi is equal to or more than 1 ppm; and
    a sphericity of said Ag ball is equal to or more than 0.90.

2. The Ag ball as recited in claim 1, wherein the alpha dose is equal to or less than 0.0010 cph/cm$^2$.

3. The Ag ball as recited in claim 1, wherein a diameter of said Ag ball is 1-1,000 μm.

4. A formed solder characterized in that a plurality of said Ag balls as recited in claim 1 are dispersed in said solder.

5. A solder paste, containing said Ag ball as recited in claim 1.

6. An Ag paste, containing said Ag ball as recited in claim 1.

7. A solder joint, using said Ag ball as recited in claim 1.

8. A flux-coated Ag ball, comprising:
    said Ag ball as recited in claim 1; and
    a flux layer coating said Ag ball.

9. A formed solder characterized in that a plurality of said flux-coated Ag balls as recited in claim 8 are dispersed in the solder.

10. A solder paste, containing a plurality of said flux-coated Ag balls as recited in claim 8.

11. An Ag paste, containing a plurality of said flux-coated Ag balls as recited in claim 8.

12. A solder joint, using said flux-coated Ag ball as recited in claim 8.

13. An Ag core ball, comprising:
    said Ag ball as recited in claim 1: and
    a solder layer coating said Ag ball;
    wherein said solder layer contains an element U in an amount equal to or less than 5 ppb and further contains an element Th in an amount equal to or less than 5 ppb.

14. The Ag core ball as recited in claim 13, wherein an alpha dose of said Ag core ball is equal to or less than 0.0200 cph/cm$^2$.

15. The Ag core ball as recited in claim 13, wherein the alpha dose of said Ag core ball is equal to or less than 0.0010 cph/cm$^2$.

16. The Ag core ball as recited in claim 13, wherein a diameter of said Ag core ball is 1-1,000 μm.

17. The Ag core ball as recited in claim 13, wherein said Ag ball is coated with a layer comprising at least one element selected from Ni and Co within said solder layer.

18. A formed solder including a plurality of said Ag core balls as recited in claim 13 dispersed in the solder.

19. A solder paste, containing a plurality of said Ag core balls as recited in claim 13.

20. An Ag core paste, containing a plurality of said Ag core balls as recited in claim 13.

21. A solder joint, using said Ag core ball as recited in claim 13.

22. A flux-coated Ag core ball, comprising:
   said Ag core ball as recited in claim 13; and
   a flux layer coating said Ag core ball over said solder layer.

23. A formed solder characterized in that a plurality of said flux-coated Ag core balls as recited in claim 22 are dispersed in the solder.

24. A solder paste, containing said flux-coated Ag core ball as recited in claim 22.

25. An Ag core paste, containing said flux-coated Ag core ball as recited in claim 22.

26. A solder joint using said flux-coated Ag core ball as recited in claim 22.

27. The Ag ball as recited in claim 2, wherein a diameter of said Ag ball is 1-1,000 μm.

28. A formed solder characterized in that a plurality of said Ag balls as recited in claim 2 are dispersed in said solder.

29. A formed solder characterized in that a plurality of said Ag balls as recited in claim 3 are dispersed in said solder.

30. A solder paste, containing said Ag ball as recited in claim 2.

31. A solder paste, containing said Ag ball as recited in claim 3.

32. An Ag paste, containing said Ag ball as recited in claim 2.

33. An Ag paste, containing said Ag ball as recited in claim 3.

34. A solder joint, using said Ag ball as recited in claim 2.

35. A solder joint, using said Ag ball as recited in claim 3.

36. A flux-coated Ag ball, comprising:
   said Ag ball as recited in claim 2; and
   a flux layer coating said Ag ball.

37. A flux-coated Ag ball, comprising:
   said Ag ball as recited in claim 3; and
   a flux layer coating said Ag ball.

38. An Ag core ball, comprising:
   said Ag ball as recited in claim 2 and
   a solder layer coating said Ag ball;
   wherein said solder layer contains an element U in an amount equal to or less than 5 ppb and further contains an element Th in an amount equal to or less than 5 ppb.

39. An Ag core ball, comprising:
   said Ag ball as recited in claim 3 and
   a solder layer coating said Ag ball;
   wherein said solder layer contains an element U in an amount equal to or less than 5 ppb and further contains an element Th in an amount equal to or less than 5 ppb.

* * * * *